(12) United States Patent
Lamorey et al.

(10) Patent No.: US 6,943,810 B2
(45) Date of Patent: Sep. 13, 2005

(54) LAYERED ARTICLE DATA VERIFICATION

(75) Inventors: Mark C. H. Lamorey, South Burlington, VT (US); Rick L. Mohler, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 09/683,712

(22) Filed: Feb. 6, 2002

(65) Prior Publication Data

US 2003/0189577 A1 Oct. 9, 2003

(51) Int. Cl.[7] .................................................. G09G 5/00

(52) U.S. Cl. ........................ 345/629; 345/418; 345/630; 716/11

(58) Field of Search .................................. 345/418, 416, 345/629, 630, 904; 716/11, 19; 703/13

(56) References Cited

U.S. PATENT DOCUMENTS

| | | | | |
|---|---|---|---|---|
| 4,785,399 A | * | 11/1988 | Evans et al. | 345/810 |
| 4,849,921 A | * | 7/1989 | Yasumoto et al. | 708/201 |
| 5,640,497 A | * | 6/1997 | Woolbright | 716/11 |
| 6,212,671 B1 | * | 4/2001 | Kanehira et al. | 716/19 |
| 6,370,679 B1 | * | 4/2002 | Chang et al. | 716/19 |
| 6,757,645 B2 | * | 6/2004 | Chang et al. | 703/13 |

* cited by examiner

*Primary Examiner*—Kimbinh T. Nguyen
(74) *Attorney, Agent, or Firm*—Richard M. Kotulak; Hoffman, Warnick & D'Alessandro LLC

(57) ABSTRACT

A method, system and program product to verify a data preparation employed on a plurality of design layers that make up an article. An instruction algorithm representative of the data preparation is restated in terms of fundamental algorithms having corresponding graphical representations. The graphical representations can be combined to form a combination graphical representation that is used to determine whether the data preparation is correct. The invention can be used to verify correct data preparation of highly complex articles.

18 Claims, 5 Drawing Sheets

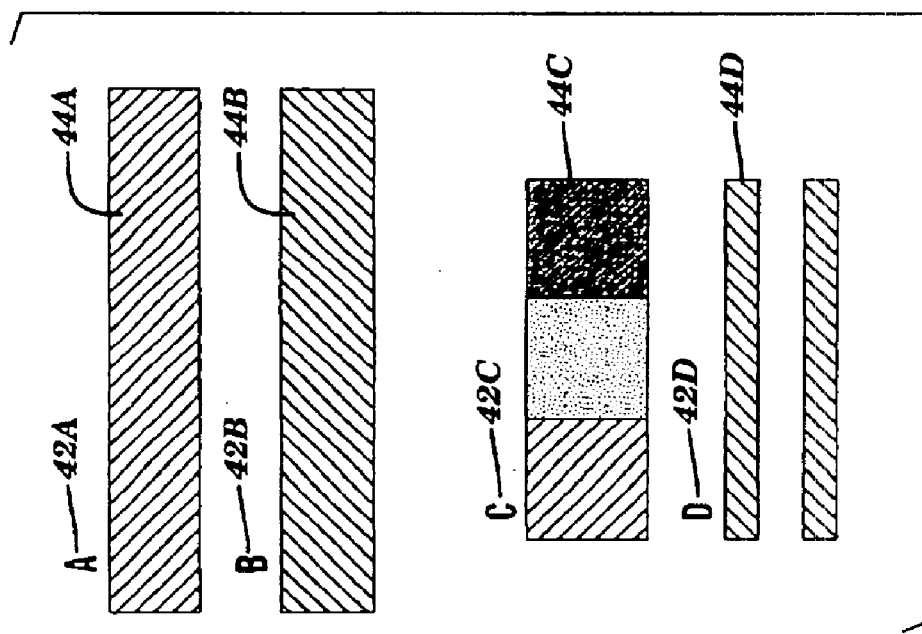
FIG. 5
FIG. 4
FIG. 3

US 6,943,810 B2

LAYERED ARTICLE DATA VERIFICATION

BACKGROUND OF THE INVENTION

1. Technical Field

The present invention relates generally to layered articles, and more particularly, to verification of layered article data preparation.

2. Related Art

There are a variety of applications where an article is used to create a product is formed by a number of design layers. Exemplary applications include: glass or metal etching and semiconductors. In these applications, data preparations are created to direct the construction of an article, e.g., a tool such as a screen(s), template(s) or mask(s), used to create the final product or for the actual final product. For instance, in terms of semiconductor masks, data preparations representative of particular treatments of design layers to be used to build the mask are created. Each application may have its own unique manner of indicating what treatments are necessary. In any application, knowing whether a data preparation will create the desired product is critical in preventing wasted resources.

Unfortunately, many of the articles used in these applications are fairly complex because of, for example, the large number of design layers, the requirement for a number of discrete segments (e.g., $10^6+$), and different requirements for each layer and/or segment. The complexity makes test runs too time-consuming and expensive. In addition, relative to semiconductors, masks are oftentimes built in a different location than where manufacturing will occur, which further prevents test runs.

In view of the foregoing, there is a need for improved verification of a data preparation for articles constructed of multiple design layers.

SUMMARY OF THE INVENTION

The invention includes a system, method and program product to verify a data preparation is correct for an article constructed of a plurality of design layers. An instruction algorithm representative of the data preparation is reduced to fundamental algorithms having corresponding fundamental graphical representations. The graphical representations can be combined to form a combination graphical representation that is used to determine whether the data preparation is correct. The invention can be used to verify correct data preparation of highly complex articles.

A first aspect of the invention is directed to a method of verifying a data preparation for an article constructed of a plurality of design layers, the data preparation being stated in terms of an instruction algorithm, the method comprising the steps of: restating the instruction algorithm in terms of at least two fundamental algorithms; creating a graphical representation for each fundamental algorithm; combining the graphical representations corresponding to each fundamental algorithm according to the restated instruction algorithm to form a combined graphical representation; and determining whether the data preparation is correct based on the combined graphical representation.

A second aspect of the invention is directed to a system for verifying a data preparation for an article constructed of a plurality of design layers, the system comprising: means for restating an instruction algorithm representative of the data preparation for the article in terms of at least two fundamental algorithms; means for creating a graphical representation for each fundamental algorithm; means for combining the graphical representations corresponding to the at least two fundamental algorithms to form a combined graphical representation; and means for determining whether data preparation is correct based on the combined graphical representation.

A third aspect of the invention is directed to a computer program product comprising a computer useable medium having computer readable program code embodied therein for verifying a data preparation for an article constructed of a plurality of design layers, the program product comprising: program code configured to restate an instruction algorithm representative of the data preparation for the article in terms of at least two fundamental algorithms; program code configured to create a graphical representation for each fundamental algorithm; program code configured to combine the graphical representations corresponding to the at least two fundamental algorithms to form a combined graphical representation; and program code configured to determine whether the data preparation is correct based on the combined graphical representation.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein:

FIG. 3 shows exemplary graphical representations used by the system of FIG. 1;

FIG. 4 shows an exemplary combined graphical representation;

FIG. 5 shows a result of the combined graphical representation of FIG. 4;

DETAILED DESCRIPTION OF THE INVENTION

For purposes of description, the following terminology will be employed: An "article" is something that is used to create a product; the article is created using at least two design layers. An article generally is used in an integration process or a layered manufacturing process such as semiconductor manufacture. For instance, the article may be a tool such as a mask, template, screen, etc., used to create the product. A "product" refers to an intended final object created. In terms of semiconductor manufacture, the product would be the circuitry created by the mask, or the actual wafer. As an alternative, the article may also be the product itself depending on the application. For instance, in terms of semiconductors, the article may be for the mask, while for glass etching, the article may be of the final etched-glass product. An "instruction algorithm" is a definition of the article made up of mathematical functions (e.g., group theory) of design layers. A "design layer" shall be used herein to refer to some basic shape, area or form known within a particular application that is used to create the article. Within the exemplary application of semiconductor manufacturer, a semiconductor mask may be the article and a design layer may be a generic photomask level. Alternatively, the design layer may be the layers of circuitry and the article may be the actual wafer.

Figure 1:
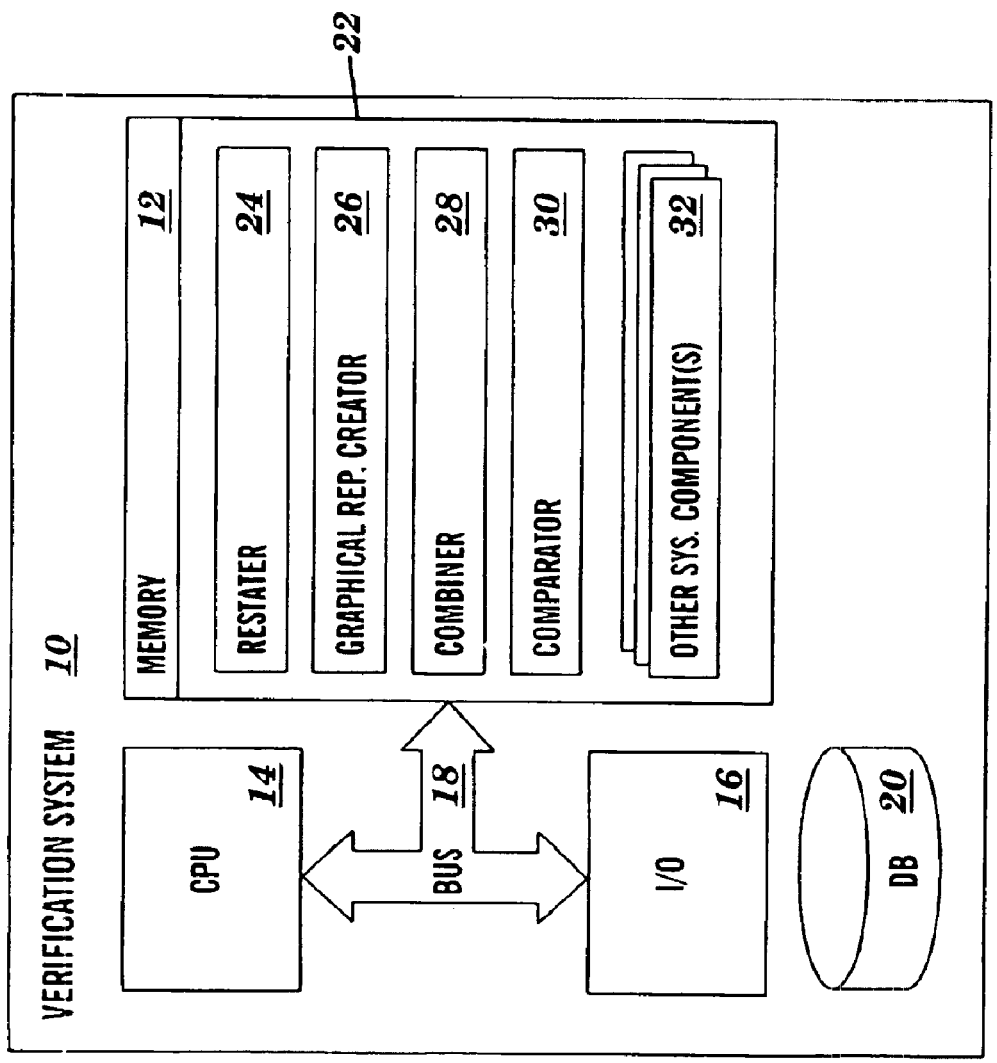
FIG. 1 shows a block diagram of a verification system in accordance with the invention.

With reference to the accompanying drawings, FIG. 1 is a block diagram of a verification system 10 in accordance with the invention. Verification system 10 preferably includes a memory 12, a central processing unit (CPU) 14, input/output devices (I/O) 16 and a bus 18. A database 20 may also be provided for storage of data relative to processing tasks. Memory 12 preferably includes a program product 22 that, when executed by CPU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. CPU 14 may likewise comprise a single processing unit, or a plurality of processing units distributed across one or more locations. A server computer typically comprises an advanced mid-range multiprocessor-based server, such as the RS6000 from IBM, utilizing standard operating system software, which is designed to drive the operation of the particular hardware and which is compatible with other system components and I/O controllers. I/O 16 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 1, program product 22 may include a restater 24, a graphical representation (rep.) creator 26, a combiner 28, a comparator 30 and other system components 32. Other system components 32 may be any complementary functions to verification system 10 not explicitly delineated below.

Figure 2:
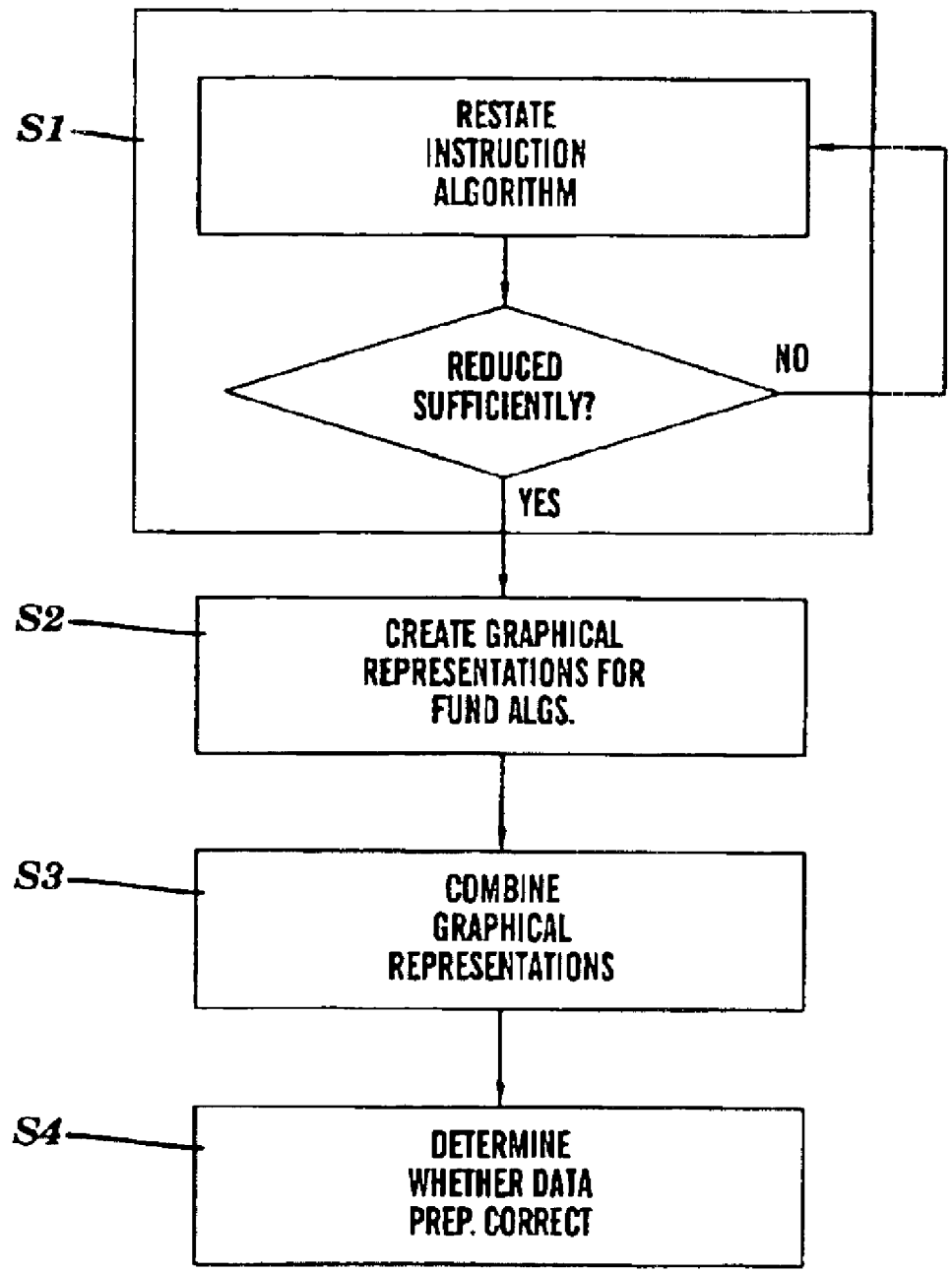
FIG. 2 shows a flow diagram of a method in accordance with the invention.

Operation of system 10 and implementation of the method will be described relative to FIGS. 2–7. In a first step S1, shown in FIG. 2, an instruction algorithm that represents or instructs on the construction of the desired article is restated by restater 24. As indicated in FIG. 2, this may be a reiterative process. The instruction algorithm as prepared may be referred to as a "data preparation." The restating step includes reducing the instruction algorithm to a point where it can be stated in terms of at least two fundamental algorithms. In one embodiment, the step of restating includes organizing the instruction algorithm according to group theory operators, e.g., union, intersection, exclusive. The type of operators, however, can be changed to accommodate different applications. For instance, boolean algebra may be more appropriate for some applications.

A "fundamental algorithm" is an instruction that represents a convenient restating or grouping of element(s) used in an instruction algorithm and, hence, convenient restating or grouping of design layer(s). In other words, a fundamental algorithm may represent a single basic design layer definition or a compound design layer definition that is particular to the application. For instance, in FIG. 3, fundamental algorithm 42C may represent a compound design layer definition indicated as WA+VL+VN for the particular application, i.e., C=WA+VL+VN. In addition, fundamental algorithms may include multiple elements, e.g., A=B, C–D, etc.

An exemplary instruction algorithm such as VSarticle=((WN=VK)–VSNOT)+VSDL) may be restated using grouping fundamental algorithm A=(WN=VK) to VSarticle=((A–VSNOT)+VSDL). VSarticle indicates an article referred to as VS and VSDL indicates a design layer also referred to as VS. A second reiteration may use fundamental algorithm B=A–VSNOT to further restate the instruction algorithm as VSarticle=B+VSDL. A third reiteration may use fundamental algorithm C=VSDL to restate the instruction algorithm as VSarticle=B+C. A fourth reiteration may use fundamental algorithm D=B+C to restate the instruction algorithm as VSarticle=D.

In contrast, an instruction algorithm may be as simple as WNarticle=WNDL, and a restating fundamental algorithm may include A=WNDL, i.e., the fundamental algorithm is simply a restatement of a design layer. Accordingly, the instruction algorithm may be restated as WNarticle=A. Another example is shown in FIG. 3, where fundamental algorithm 42D may represent a single design layer definition indicated as VN for the particular application, i.e., D=VN.

The instruction algorithm and article can be very complex. For instance, where the article is a semiconductor mask, the instruction algorithm may include many parameters. The following table illustrates sample instruction algorithms for masks in a semiconductor manufacturer. The mask includes discrete segments 1–3, which each have their own respective instruction algorithm. Each segment could also be considered a design layer.

| Mask/Article | Segment 1 | Segment 2 | Segment 3 |
| --- | --- | --- | --- |
| VS | WN = VK | {[(WN = VK) – VSNOT] + VS} | (WS = VK) + KERKVS + NEGMKS |
| PK | WN = VK | WN = VK | (WN = VK) + KERFPK + NEGMKS |
| XN | (XA + XP) + XN | [(XA + XP + YAK) – XN] | {[XA + XP] – XN + KERFXN – POSMKS + PROTECT + FRAME |
| VS | (WN = VK) | {[(WN = VSNOT] + VS} | [WN = VK] + KERFVS + NEGMKS |

In step S2, a graphical representation for each fundamental algorithm is created using creator 26. Referring to FIG. 3, each fundamental algorithm 42A–D has a corresponding graphical representation 44A–D. FIG. 4 represents a fundamental algorithm 42E that includes two elements C–D and a multiple part graphical representation 44E. Although, the graphical representations shown are rectangular and have set cross-hatching or shades of gray coloring, it should be recognized that a variety of graphical representations can be created depending on the application. For instance, a variety of graphical representations having different shapes, shading, coloring, size, parts, etc. may be created. A convenient set of these graphical representations may be created for each application.

Actual implementation of creator 26 may take any of a variety of well-known data entry formats. For instance, creator 26 may be implemented through a graphical user interface having a graphical representation entry section in the form of a drawing system and an entry section for the corresponding fundamental algorithm.

In step S3, the graphical representations corresponding to the at least two fundamental algorithms are combined by combiner 28 according to the restated instruction algorithm to form a combined graphical representation. Combination is made by the above-mentioned operators depending on application. With group theory, combination is made using, for example, union, intersection and exclusive. For instance, referring to FIG. 4, the above-mentioned fundamental algorithms C and D may be combined according to instruction algorithm ((WA+VL+VN)–VN) to C–D.

This would result in a combined graphical representation 44, as shown in FIG. 4. That is, C–D may be a fundamental algorithm or a combination of fundamental algorithms.

In step S4, a determination is made by comparator 30 whether the data preparation is correct based on the combined graphical representation. This determination may take many forms. Where the article is the product, the graphical representation may be implemented, i.e., used to create the final product electronically, and the result compared to the final product. The final product may be actually created as part of the process or by some other entity. For instance, as shown in FIG. 5, a result of implementation of the combined graphical representation of FIG. 4 is shown. Where the article is for a tool such as a mask, the combined graphical representation and desired tool may be compared to make the determination. Depending on application, the comparison can be completed visually or the desired article may be input/imported into system 10 for electronic comparison. If the combined graphical representation is correct, the user knows the instruction algorithm/data preparation is correct. Otherwise, the user knows the instruction algorithm/data preparation requires adjustment before commitment to physical form or continuation of processing.

Figure 6:
FIG. 6 shows a table of correct positive preparations for a variety of fundamental algorithms.
Figure 7:
FIG. 7 shows a table of correct negative preparations for a variety of fundamental algorithms.

Depending on application, the determination step may also require additional processing by system 10. For instance, where the article is a semiconductor mask, the ultimate data preparation may need to be for a negative. Accordingly, a determination of the polarity of the article and appropriate inversion of the combined graphical representation may be required prior to the determination. This is exemplified by comparing FIGS. 6 and 7. FIG. 6 shows correct positive preparations and FIG. 7 correct negative preparations for a variety of algorithms for a mask. In FIGS. 6 and 7, 'Polarity' represents whether the article is based on a positive (CP) or negative (CN) of the product; 'CGR' represents the combined graphical representation; 'D_Prep' represents the implementation of the combined graphical representation, i.e., the mask; and 'Result' represents implementation of the D_Prep, i.e., the result on the final product. As expected, in FIG. 6, the Results are negatives of the D_Prep, while in FIG. 7, the Results are commensurate with the D-Prep.

As noted above, articles can be very complex and may include a number of discrete segments. For instance, in the above table, each segment may represent a discrete segment of a mask. Segment 3 may represent a frame feature, and segments 1 and 2 mask features to be placed within the frame feature. In this case, the above-described method may be repeated for each discrete segment within a larger article.

The above-described system and method provides a mechanism to verify data preparation for an article without wasting resources. The invention finds advantage with practically any type of application where an article is constructed of multiple design layers, e.g., etching on glass, etching on metal, mask building, etc.

Another embodiment of the invention includes a set of graphical representations as described above that can be used to verify a data preparation for creating an article having a plurality of design layers is correct.

In the previous discussion, it will be understood that the method steps discussed preferably are performed by a processor, such as CPU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of verifying a data preparation for an article constructed of a plurality of design layers, the data preparation being stated in terms of an instruction algorithm, the method comprising the steps of:

restating the instruction algorithm in terms of at least two fundamental algorithms, each fundamental algorithm representing at least one design layer of the plurality of design layers;

creating a graphical representation for each fundamental algorithm;

combining the graphical representations corresponding to each fundamental algorithm according to the restated instruction algorithm to form a combined graphical representation; and determining whether the data preparation is correct based on the combined graphical representation, wherein the determining includes, but not limited to, electronic comparison between the combined graphical representation and a graphical representation based on the article.

2. The method of claim 1, wherein the step of restating includes organizing the instruction algorithm according to group theory operators.

3. The method of claim 1, wherein the step of determining includes determining a polarity of the product.

4. The method of claim 3, further comprising the step of inverting the combined graphical representation prior to the determining step.

5. The method of claim 1, wherein the step of restating is a reiterative process.

6. The method of claim 1, wherein the article is for one of: an etching and a mask.

7. The method of claim 1, wherein the article includes a plurality of discrete segments for which verification is performed.

8. The method of claim 1, wherein the determining step includes implementing the combined graphical representation and comparing the result to the article.

9. The method of claim 1, wherein the determining step includes comparing the combined graphical representation to the article.

10. A system for verifying a data preparation for an article constructed of a plurality of design layers, the system comprising:

means for restating an instruction algorithm representative of the data preparation for the article in terms of at least two fundamental algorithms, each fundamental algorithm representing at least one design layer of the plurality of design layers;

means for creating a graphical representation for each fundamental algorithm;

means for combining the graphical representations corresponding to the at least two fundamental algorithms to form a combined graphical representation; and means for determining whether data preparation is correct based on the combined graphical representation, wherein the determining includes, but not limited to, electronic comparison between the combined graphical representation and a graphical representation based on the article.

11. The system of claim 10, wherein the means for determining implements the combined graphical representation and compares the result to the article.

12. The system of claim 10, wherein the means for determining compares the combined graphical representation to the article.

13. A computer program product comprising a computer useable medium having computer readable program code embodied therein for verifying a data preparation for an article constructed of a plurality of design layers, the program product comprising:

program code configured to restate an instruction algorithm representative of the data preparation for the article in terms of at least two fundamental algorithms, each fundamental algorithm representing at least one design layer of the plurality of design layers;

program code configured to create a graphical representation for each fundamental algorithm;

program code configured to combine the graphical representations corresponding to the at least two fundamental algorithms to form a combined graphical representation; and program code configured to determine whether the data preparation is correct based on the combined graphical representation, wherein the determining includes, but not limited to, electronic comparison between the combined graphical representation and a graphical representation based on the article.

14. The program product of claim 13, further comprising program code configured to determine a polarity of the product.

15. The program product of claim 14, further comprising program code configured to invert the combined graphical representation.

16. The program product of claim 13, wherein the article includes a plurality of discrete segments for which verification is performed.

17. The program product of claim 13, determine implements the combined graphical representation and compares the result to the article.

18. The program product of claim 13, wherein the program code configured to determine compares the combined graphical representation to the article.

* * * * *